United States Patent [19]

Chino et al.

[11] Patent Number: 5,416,044
[45] Date of Patent: May 16, 1995

[54] METHOD FOR PRODUCING A SURFACE-EMITTING LASER

[75] Inventors: Toyoji Chino, Toyonaka; Kenichi Matsuda, Moriguchi, all of Japan

[73] Assignee: Matsushita Electric Industrial Co., Ltd., Osaka, Japan

[21] Appl. No.: 209,558

[22] Filed: Mar. 11, 1994

[30] Foreign Application Priority Data

Mar. 12, 1993 [JP] Japan .................................. 5-051882

[51] Int. Cl.[6] .......................................... H01L 21/20
[52] U.S. Cl. ................ 437/129; 148/DIG. 95; 148/DIG. 12; 117/1
[58] Field of Search ............... 437/129; 148/DIG. 12, 148/DIG. 95; 117/1

[56] References Cited

U.S. PATENT DOCUMENTS

| | | | |
|---|---|---|---|
| 4,801,993 | 1/1989 | Ankri et al. | |
| 5,206,872 | 4/1993 | Jewell et al. | 372/46 |
| 5,245,622 | 9/1993 | Jewell et al. | 372/45 |
| 5,256,596 | 10/1993 | Ackley et al. | 437/129 |

FOREIGN PATENT DOCUMENTS 2-156591   6/1990   Japan .

OTHER PUBLICATIONS

Y. J. Yang et al., "Single-Mode Operation of Mushroom Structure Surface Emitting Lasers", *IEEE Photonics Technology Letters*, vol. 3, No. 1, pp. 9–11 (Jan. 1991).

J. L. Jewell et al., "Vertical-Cavity Surface-Emitting Lasers: Design, Growth, Fabrication, Characterization", *IEEE Journal of Quantum Electronics*, vol. 27, No. 6, pp. 1332–1346 (Jun. 1991).

R. S. Geels et al., "InGaAs Vertical-Cavity Surface-Emitting Lasers", *IEEE Journal of Quantum Electronics*, vol. 27, No. 6, pp. 1359–1367 (Jun. 1991).

Primary Examiner—R. Bruce Breneman
Assistant Examiner—Linda J. Fleck
Attorney, Agent, or Firm—Ratner & Prestia

[57] ABSTRACT

A method for producing a surface-emitting laser, includes the steps of: forming a mask pattern to define a top mirror on a semiconductor substrate, the semiconductor substrate having a first semiconductor multilayer formed on the semiconductor substrate, a second semiconductor multilayer formed on the first semiconductor multilayer, and a third semiconductor multilayer formed on the second semiconductor multilayer, the first semiconductor multilayer constituting a bottom mirror, the second semiconductor layer including an upper barrier layer and a lower barrier layer, and an active layer sandwiched between the upper and lower barrier layers, the third semiconductor multilayer constituting a top mirror; forming the top mirror by partially removing the third semiconductor layer by dry etching using the mask pattern as a mask until the surface of the upper barrier layer of the second semiconductor multilayer is exposed; forming an etching protective film at least on the side of the top mirror; partially removing the active layer, the upper barrier layer, and the lower barrier layer by dry etching using the mask pattern and the etching protective film as masks; and partially removing the active layer, the upper barrier layer, and the lower barrier layer by wet etching so that the active layer has an area smaller than that of the top mirror.

7 Claims, 8 Drawing Sheets

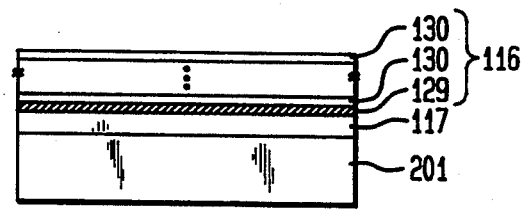
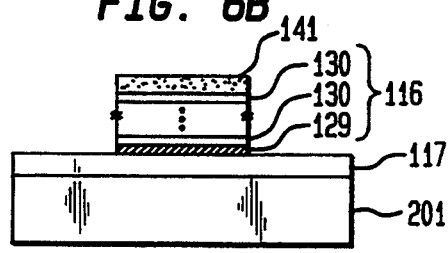
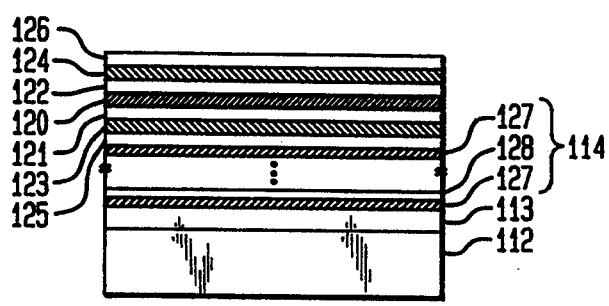
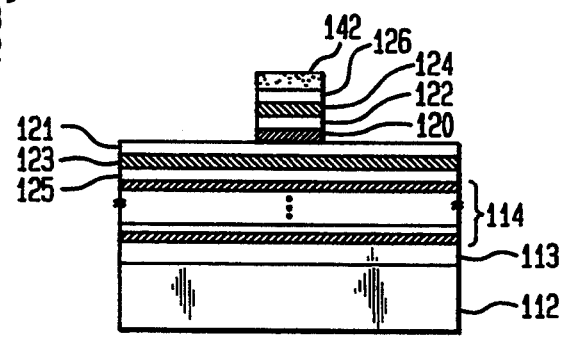
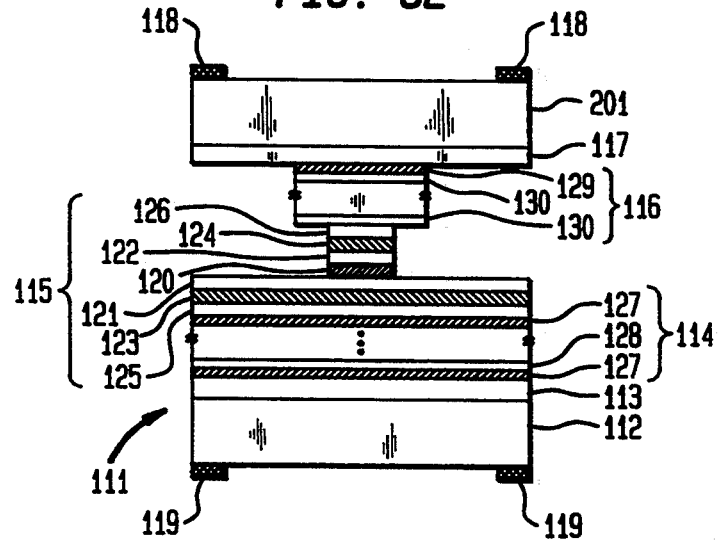

METHOD FOR PRODUCING A SURFACE-EMITTING LASER

BACKGROUND OF THE INVENTION

1. Field of the Invention

The present invention relates to a semiconductor laser and a method for producing the same, especially relates to a surface-emitting laser and a method for producing the same.

2. Description of the Related Art

A vertical-cavity surface-emitting laser (hereinafter, referred as a surface-emitting laser) has recently attracted to a number of researchers for the following reasons. The surface-emitting laser includes a laser oscillator interposed between laser mirrors. The laser oscillator is formed in a direction perpendicular to a substrate, and the laser mirrors have semiconductor crystalline surfaces from which the laser beam is emitted. With such a configuration, a surface-emitting laser can emit a laser beam at a low threshold current. The laser beam is emitted from a large light emitting surface and has a narrow emitting angle. The semiconductor substrate is not required to be cleaved so as to form light emitting surfaces, thereby improving the production yield of the surface-emitting laser. Moreover, such a configuration makes it possible to perform an operation test for the surface-emitting laser at a unit of a wafer before being divided into chips. Furthermore, a two-dimensional laser array can be easily formed. Such attractive features of the surface-emitting laser are expected to solve some of the problems of conventional edge-emitting lasers.

In the accompanying drawings, FIGS. 8A to 8D show a method for producing a conventional surface-emitting laser 300 which can be produced, for example, according to a method described in IEEE Photonic Technology Letters, Vol. 3 (1991), pp. 9–11. As is shown in FIG. 8A, on an n-GaAs substrate 301, a bottom mirror 312, a spacer layer 304, an active layer 305, a spacer layer 306, and a top mirror 313 are epitaxially grown in this order. The bottom mirror 312 is constituted by alternately forming several tens of n-$Al_{0.08}Ga_{0.92}As$ layers 302 and n-$Al_{0.6}Ga_{0.4}As$ layers 303. The top mirror 313 is constituted by alternately forming several tens of p-$Al_{0.08}Ga_{0.92}As$ layers 307 and p-$Al_{0.6}Ga_{0.4}As$ layers 308. The spacer layer 304, the active layer 305, and the spacer layer 306 are made of n-$Al_{0.35}Ga_{0.65}As$, p-GaAs, and p-$Al_{0.35}Ga_{0.65}As$, respectively.

Next, as is shown in FIGS. 8B and 8C, the top mirror 313 and the spacer layer 306 are subject to an etching step using a mixed solution of potassium dichromate, hydrogen bromide, and acetic acid, and then the active layer 305 is subject to a side etching step using a mixed solution of Clorox and water so that the area of the active layer 305 becomes smaller than that of the spacer layer 306. Finally, as is shown in FIG. 8D, a polyimide film 309 is formed on the spacer layer 304 so as to expose the surface of the top mirror 313. Then, electrodes 310 and 311 made of AuGe are formed so as to electrically connect the substrate 301 and the top mirror 313.

Furthermore, an atomic layer bonding technique for bonding different substrates to each other, which is utilized in a semiconductor laser producing method, is proposed by Conference on lasers and electro-optics 1991 in technical digest pp. 330–333. Hereinafter, this technique will be described with reference to FIGS. 9A to 9C.

As is shown in FIG. 9A, on an InP substrate 401, an n-InGaAs layer 402, an n-InP layer 403, a u-InGaAsP layer ($\lambda g=1.3$ $\mu$m) 404, a u-InGaAsP layer ($\lambda g=1.5$ $\mu$m) 405, and a p-InP layer 406 are epitaxially grown in this order using a metal organic chemical vapor deposition (MOCVD) method.

Then, under the condition where the surface of a p-GaAs substrate 407 is in contact with the surface of the p-InP layer 406 as is shown in FIG. 9B, a heat treatment is performed under a hydrogen atmosphere at a temperature of 670° C. for 30 minutes so that atoms on the surfaces of the GaAs substrate 407 and the InP layer 406 are rearranged and combined with each other. Thus, the GaAs substrate 407 and the InP layer 406 are bonded together. Finally, as is shown in FIG. 9C, the InP substrate 401 is removed using hydrochloric acid. Then, the next step for producing a laser element is performed.

In the surface-emitting laser, the bottom mirror and the top mirror function as current paths for supplying a current to the active layer. Therefore, the bottom mirror and the top mirror are required to have a large area so as to have a low resistance. On the other hand, in order to promote recombination of carriers and to improve the emitting efficacy, it is desirable for the active layer to have a small area so as to effectively confine the current.

However, according to the above-mentioned conventional technique, the top mirror is etched so as to have a taper, thereby making the top surface area thereof decreased in size. As a result, there arises a problem in that the resistance of the top mirror cannot be reduced so much. In addition, in the case where the top mirror has an appropriate top surface area, the bottom of the top mirror may be too large to integrate into a two-dimensional array of the surface-emitting lasers.

SUMMARY OF THE INVENTION

A method for producing a surface-emitting laser of this invention, includes the steps of:

forming a mask pattern to define a top mirror onto a semiconductor substrate, the semiconductor substrate having a first semiconductor multilayer formed on the semiconductor substrate, a second semiconductor multilayer formed on the first semiconductor multilayer, and a third semiconductor multilayer formed on the second semiconductor multilayer, the first semiconductor multilayer constituting a bottom mirror, the second semiconductor layer including an upper barrier layer and a lower barrier layer, and an active layer sandwiched between the upper and lower barrier layers, the third semiconductor multilayer constituting a top mirror;

forming the top mirror by partially removing the third semiconductor layer by dry etching using the mask pattern as a mask until the surface of the upper barrier layer of the second semiconductor multilayer is exposed;

forming an etching protective film on the side of the top mirror;

partially removing the active layer, the upper barrier layer, and the lower barrier layer by dry etching using the mask pattern and the etching protective film as masks; and partially removing the active layer, the upper barrier layer, and the lower barrier layer by wet etching so that the active layer has an area smaller than that of the top mirror.

In one embodiment of the invention, the method further includes the step of forming the first, second, and third semiconductor multilayers on the semiconductor substrate by an epitaxial growth method.

In another embodiment of the invention, the etching protective film is made of silicon oxide.

According to another aspect of the invention, a method for producing a surface-emitting laser using a first semiconductor substrate having a first semiconductor multilayer thereon, and a second semiconductor substrate having a second semiconductor multilayer formed thereon and a third semiconductor multilayer formed on the second semiconductor multilayer, the first semiconductor multilayer constituting a top mirror, the second semiconductor multilayer constituting a bottom mirror, and the third semiconductor multilayer including at least an active layer, the method includes the steps of:

partially removing the third semiconductor multilayer by etching so that the active layer has a desired shape; and making the surface of the first semiconductor multilayer to be in contact with the surface of the third semiconductor multilayer, and heating the second and third semiconductor multilayers under a reduction atmosphere, thereby bonding the first and third semiconductor multilayers with each other by direct bonding.

In one embodiment of the invention, the method further includes the step of partially etching the first semiconductor multilayer.

According to still another aspect of the invention, a method for producing a semiconductor laser, includes the steps of:

forming a mask pattern on a substrate including a bottom cladding layer and a top cladding layer, and an active layer sandwiched between the bottom and top cladding layers;

partially removing the upper cladding layer by dry etching using the mask pattern as a mask;

forming an etching protective film at least on the side of the etched upper cladding layer;

partially removing the active layer by dry etching using the mask pattern and the etching protective film as masks; and partially removing the active layer by wet etching, thereby making the area of the active layer smaller than that of the top mirror.

According to still another aspect of the invention, a method for producing a semiconductor laser, includes the steps of:

preparing a first substrate having a first cladding layer formed thereon and an active layer formed on the first semiconductor substrate;

partially etching the active layer; and making the surface of the active layer in contact with the surface of a second cladding layer formed on a second semiconductor substrate, and heating the first and second cladding layers under a reduction atmosphere, thereby bonding the first cladding layer with the active layer by direct bonding.

According to still another aspect of the invention, a surface-emitting laser includes:

a bottom mirror;

a semiconductor layer including at least an active layer formed on the bottom mirror; and a top mirror having a vertical side, formed on the semiconductor layer;

wherein the active layer has an area smaller than that of the top mirror.

Thus, the invention described herein makes possible the advantages of providing a surface-emitting laser including a top mirror provided with a vertical sidewall, and an active layer having an area smaller than that of the top mirror, and providing a method for producing such a surface-emitting laser.

These and other advantages of the present invention will become apparent to those skilled in the art upon reading and understanding the following detailed description with reference to the accompanying figures.

BRIEF DESCRIPTION OF THE DRAWINGS

FIGS. 6A to 6E are cross-sectional views illustrating a method for producing a surface-emitting laser according to a second example of the present invention.

DESCRIPTION OF THE PREFERRED EMBODIMENTS

Hereinafter, the present invention will be described by way of illustrating examples with reference to drawings.

EXAMPLE 1

Figure 1A:
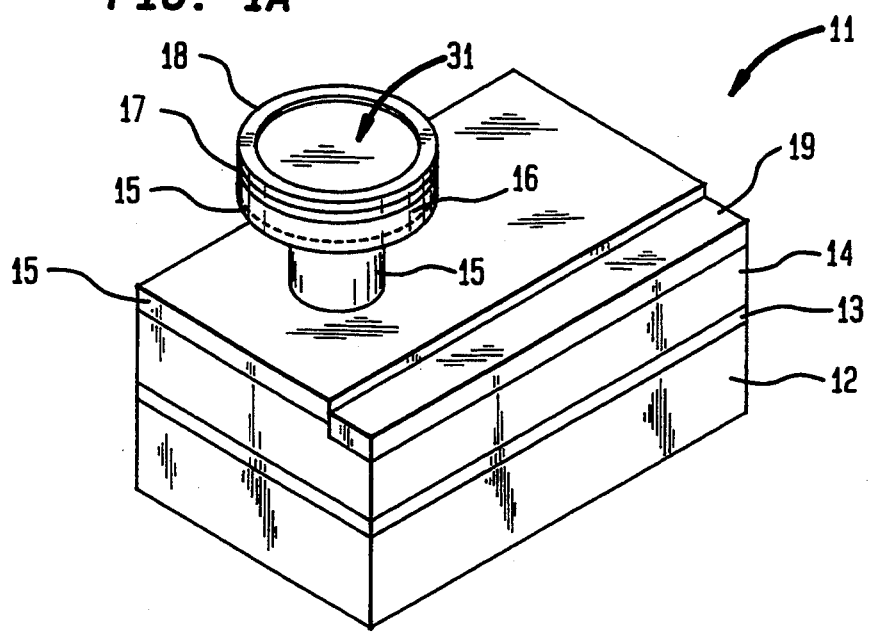
FIG. 1A is a perspective view of a surface-emitting laser according to a first example of the present invention.

FIG. 1A shows a perspective view of a surface-emitting laser 11 according to a first example of the present invention. The surface-emitting laser 11 includes:

a bottom mirror 14 formed on a substrate 12 via a buffer layer 13;

an active region 15 formed on the bottom mirror 14; and a top mirror 16 formed on the active region 15. The substrate 12 and the buffer layer 13 are made of n-GaAs and p-GaAs, respectively. The active layer 15 sandwiched between the bottom mirror 14 and the top mirror 16 functions as a vertical resonator.

Figure 1B:
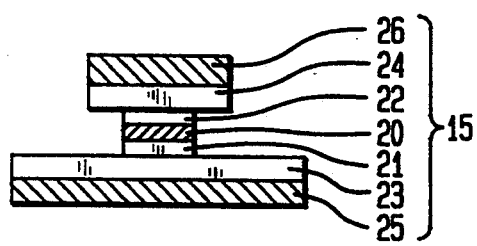
FIGS. 1B, 1C, and 1D are cross-sectional views of an active region, a bottom mirror, and a top mirror, respectively, of the surface-emitting laser.

As is shown in FIG. 1B, the active region 15 includes an active layer 20, barrier layers 21 and 22, and spacer layers 23 to 26. An active layer 20 is sandwiched between the barrier layers 21 and 22. Furthermore, the barrier layers 21 and 22 sandwiching the active layer 20 are sandwiched between the spacer layers 23 and 25, and the spacer layers 24 and 26. The active layer 20 is made of undoped $In_{0.2}Ga_{0.8}As$. The barrier layers 21 and 22 are made of undoped GaAs. The spacer layers 23 and 24 are made of undoped $Al_{0.5}Ga_{0.5}As$. The spacer layers 25 and 26 are made of p-$Al_{0.5}Ga_{0.5}As$ and n-$Al_{0.5}Ga_{0.5}As$, respectively. The barrier layers 21 and 22 confine electrons and positive holes in the active layer 20. The spacer layers 22 to 26 are provided for adjusting the length of the vertical resonator so that the laser is oscillated at a single-longitudinal mode.

Figure 1C:
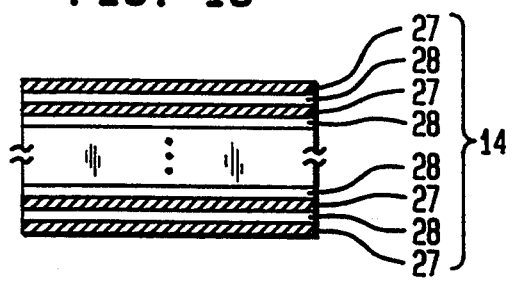
Figure 1D:
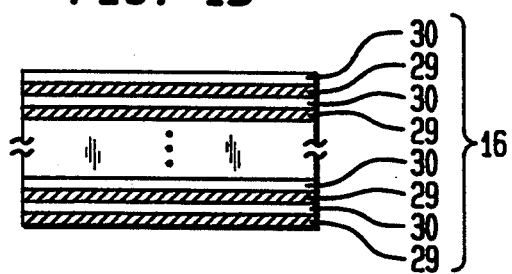

As is shown in FIG. 1C, the bottom mirror 14 is a Distributed Bragg Reflector (DBR) in which p-AlAs layers 27 and p-GaAs layers 28 are alternately formed in pairs. Thus, the bottom mirror 14 includes 24.5 pairs of the p-AlAs layers 27 and the p-GaAs layers 28. As is shown in FIG. 1D, the top mirror 16 is a Distributed Bragg Reflector (DBR) in which n-AlAs layers 29 and n-GaAs layers 30 are alternately formed in pairs. Thus, the top mirror 16 includes 24 pairs of the n-AlAs layers 29 and the n-GaAs layers 30. The respective thicknesses of the p-AlAs layer 27, the p-GaAs layer 28, the n-AlAs layer 29, and the n-GaAs layer 30 are determined so that the bottom mirror 14 and the top mirror 16 may reflect light having the same wavelength as that of light emitted from the active layer 20.

On the top mirror 16, a capping layer 17 made of n-GaAs is formed, and electrically connected to a cathode electrode 18. On the p-GaAs layer 28 of the bottom mirror 14, an anode electrode 19 is formed. The cathode electrode 18 is formed in the shape of a ring having a window 31 from which laser light is emitted.

Hereinafter, a method for producing the surface-emitting laser 11 will be described.

Figure 2A:
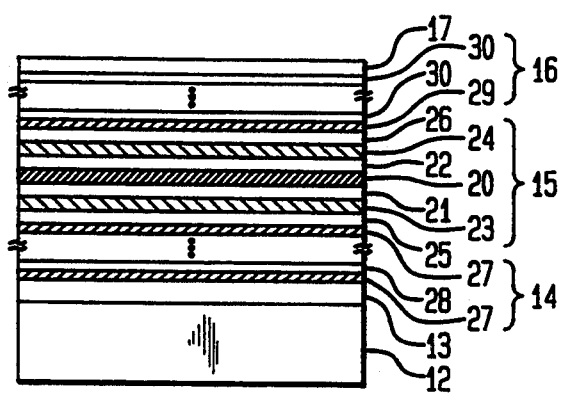
FIGS. 2A to 2F are cross-sectional views illustrating a method for producing the surface-emitting laser according to the first example of the present invention.

As is shown in FIG. 2A, on the substrate 12 made of n-GaAs, the p-GaAs buffer layer 13, and the p-AlAs layers 27, the p-GaAs layers 28, the active layer 20, the barrier layers 21 and 22, the spacer layers 23 to 26, the n-AlAs layers 29, the n-GaAs layers 30, and the capping layer 17 are epitaxially grown. The p-AlAs layers 27 and the p-GaAs layers 28 constitute a first semiconductor multilayer for the bottom mirror 14. The active layer 20, the barrier layers 21 and 22, and the spacer layers 23 to 26 constitute a second semiconductor multilayer for the active region 15. The n-AlAs layers 29 and the n-GaAs layers 30 constitute a third semiconductor multilayer for the top-mirror 16. Various epitaxial growth methods are well known for forming these semiconductor layers, but especially a metal organic chemical vapor deposition (MOCVD) method and a molecular beam epitaxy (MBE) method are preferably used so as to accurately control the respective thicknesses of the semiconductor layers. The following Table shows the respective compositions and thicknesses of the semiconductor layers.

| layer | composition | thickness (nm) | impurity concentration (cm$^{-3}$) |
|---|---|---|---|
| buffer layer 13 | p-GaAs | 500 | Be: $5 \times 10^{18}$ |
| p-AlAs layer 27 | p-AlAs | 82.8 | Be: $1 \times 10^{18}$ |
| p-GaAs layer 28 | p-GaAs | 69.6 | Be: $1 \times 10^{18}$ |
| spacer layer 25 | p-$Al_{0.5}Ga_{0.5}As$ | 86 | Be: $1.5 \times 10^{18}$ |
| spacer layer 23 | u-$Al_{0.5}Ga_{0.5}As$ | 500 | |
| barrier layer 21 | u-GaAs | 10 | |

-continued

| layer | composition | thickness (nm) | impurity concentration (cm$^{-3}$) |
|---|---|---|---|
| active layer 20 | u-$In_{0.2}Ga_{0.8}As$ | 8 | |
| barrier layer 22 | u-GaAs | 10 | |
| spacer layer 24 | u-$Al_{0.5}Ga_{0.5}As$ | 500 | |
| spacer layer 26 | n-$Al_{0.5}Ga_{0.5}As$ | 86 | Si: $1.5 \times 10^{18}$ |
| n-AlAs layer 29 | n-AlAs | 82.8 | Si: $1 \times 10^{18}$ |
| n-GaAs layer 30 | n-GaAs | 69.6 | Si: $1 \times 10^{18}$ |
| capping layer 17 | n-GaAs | 69.6 | Si: $5 \times 10^{19}$ |

The active layer 20 has a band gap wavelength $\lambda g = 0.98$ μm. Therefore, the bottom mirror 14 and the top mirror 16 are made so as to reflect light having a wavelength of 0.98 μm. Such a mirror is well known as a Distributed Bragg Reflector (DBR), and this mirror can be designed so as to reflect an arbitrary wavelength by setting the respective refractive indexes and thicknesses of semiconductor layers constituting the mirror at prescribed values. According to the present example, about 99% of the light can be reflected by forming 24 pairs of the GaAs layers and the AlAs layers.

Figure 2D:
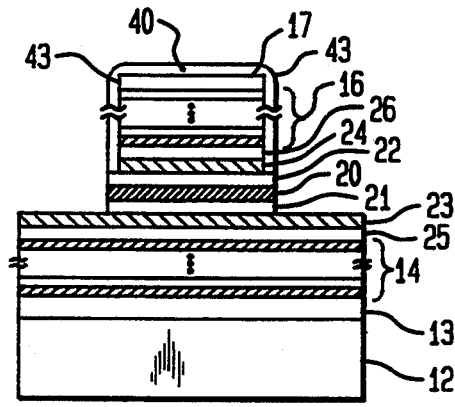
Figure 2B:
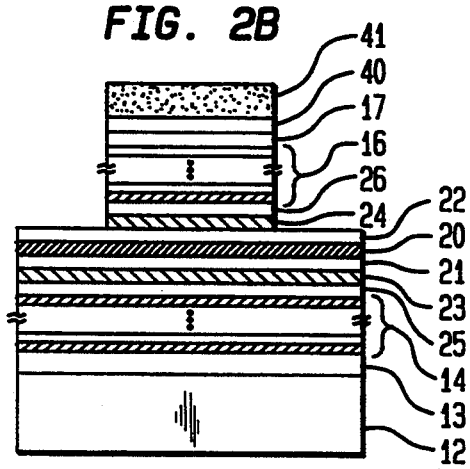

As is shown in FIG. 2B, a silicon oxide film 40 is formed on the capping layer 17, and thereafter a resist pattern 41 is formed on the silicon oxide film 40. The silicon oxide film is formed by a photo CVD, a plasma CVD, or a thermal CVD. The resist pattern 41 defines the area of the top mirror 16. The top mirror 16 has high resistance due to band gap discontinuity between the respective AlAs layers and the respective GaAs layers. Accordingly, the resist pattern 41 is desired to have an area as large as possible in order to decrease the resistance. However, the resist pattern 41 should be made small in order to two-dimensionally integrate a plurality of the surface-emitting lasers 11. Therefore, the resist pattern 41 is preferably made in the shape of a circle having a diameter of about 10 to 15 m.

The semiconductor layers are subject to a dry etching step using the resist pattern 41 as a mask. First, air in a reaction chamber is discharged until the degree of the vacuum becomes $1 \times 10^{-4}$ Torr or less, preferably $9 \times 10^{-7}$ Torr or less. Then, the dry etching step is performed under a pressure of 30 mTorr or less, preferably about 5 mTorr, using chlorine gas having a flow rate of 1 sccm and argon gas having a flow rate of 20 sccm. Under such conditions, the semiconductor layers can be etched in a direction perpendicular to the surface of the substrate 12. The etching time is controlled so as to expose the surface of the barrier layer 22. In this etching step, the top mirror 16 having a vertical round side is formed.

After the resist pattern 41 is removed, a silicon oxide film (not shown) is formed so as to cover the entire surface of the substrate 12, and then the silicon oxide film is subject to a dry etching step until the surface of the barrier layer 22 is exposed. Thus, as is shown in FIG. 2C, a sidewall 43 is formed on the round side of the top mirror 16 and the spacer layers 24 and 26. Thereafter, as is shown in FIG. 2D, the barrier layers 21 and 22 and the active layer 20 are partially removed using the silicon oxide film 40 and the sidewall 43 as a mask by the above dry etching method until the surface of the spacer layer 23 is exposed. In this etching step, the silicon oxide film 40 may be etched, but the etching rate for the silicon oxide film 40 is smaller than the etching rates for the active layer 20 and the spacer layers 22 and 21. Therefore, the surface of the spacer layer 23 is exposed before the silicon oxide film 40 is perfectly etched.

Figure 2E:
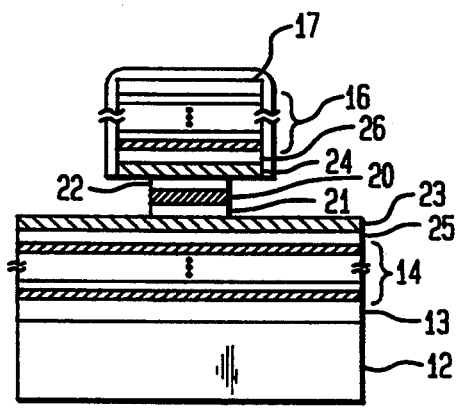
Figure 2C:
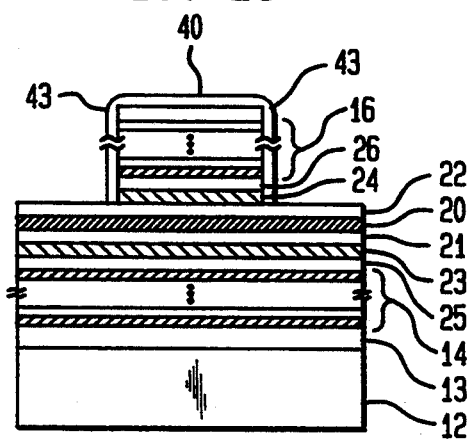

Next, as is shown in FIG. 2E, the substrate 12 is immersed in a mixed solution of citric acid, hydrogen peroxide, and water at a weight ratio of 1:1:1 while maintaining a temperature of 20° C. By this mixed solution, GaAs is etched, but $Al_{0.5}Ga_{0.5}As$ is slightly etched. Therefore, as is shown in FIG. 2E, the barrier layers 21 and 22, which are made of GaAs and exposed at sides, are selectively etched. The side of the n-GaAs layer 30 constituting the top mirror 16 is covered with the sidewall, and so is not etched at all. The spacer layer 23 is exposed at surface but is made of $Al_{0.5}Ga_{0.5}As$, thereby not being etched as well. The active layer 20 made of $In_{0.5}Ga_{0.5}As$ is etched at an etching rate slower than that of the barrier layers 21 and 22. However, the active layer 20 is partially removed together with parts of the barrier layers 21 and 22 since the width of the active layer 20 is thin and active layer 20 is sandwiched between the barrier layers 21 and 22.

The etching time is determined so that the active layer 20 has a prescribed area. The area of the active layer 20 can arbitrarily be determined irrespective of the area of the top mirror 16. However, the area of the active layer 20 is desired to be as small as possible so as to reduce the threshold current across the active layer 20 and to increase the current density of the active layer 20. Normally, the diameter of the active layer 20 is preferably about 3 to 5 times as large as that of the wavelength. If neglecting the restriction of the producing process and the problem of heat radiation at the active layer 20, the diameter of the active layer 20 is preferably the same as that of the emission wavelength. According to the present example, the emission wavelength is 0.98 μm, so that the area of the active layer 20 preferably has the shape of a circle having a diameter of about 3 to 5 μm.

Figure 2F:
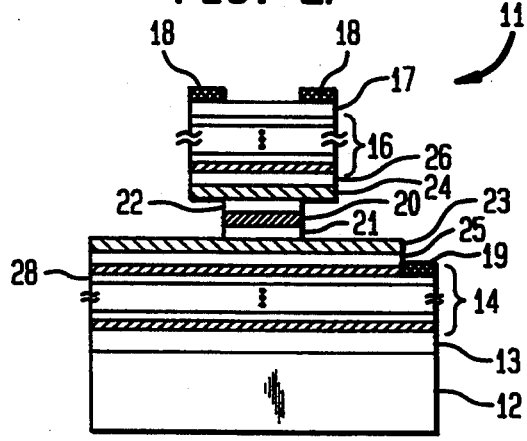
Figure 3:
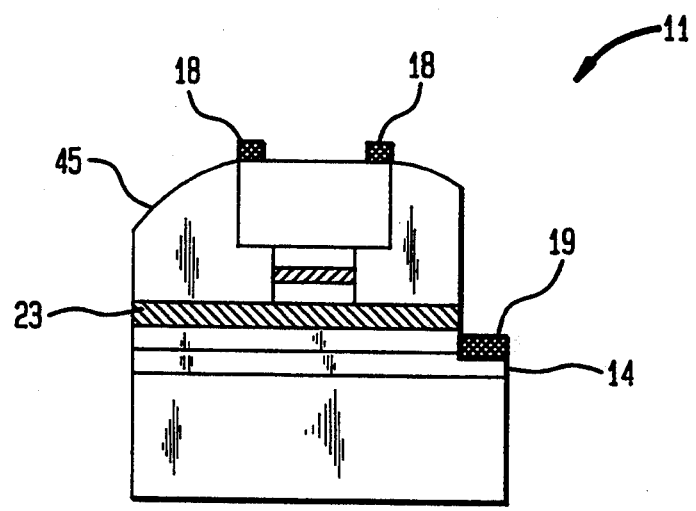
FIG. 3 shows a surface-emitting laser including a protective film according to the present invention.

Finally, as is shown in FIG. 2F, the silicon oxide film 40 and the sidewall 43 are removed, and then the cathode electrode 18 is formed on the capping layer 17. The anode electrode 19 is formed on the p-GaAs layer 28 of the bottom mirror 14 after the spacer layers 23 and 25 and the p-AlAs layer 27 are partially removed using a hydrofluoric acid solution. This is because a semiconductor layer made of GaAs can easily be in good ohmic contact with a electrode made of metal. After the electrodes 18 and 19 are formed, a protective film 45 made of polyimide and the like may be formed on the spacer layer 23 so as to cover the sides of the active region 15 and the top mirror 16, as is shown in FIG. 3.

Figure 4:
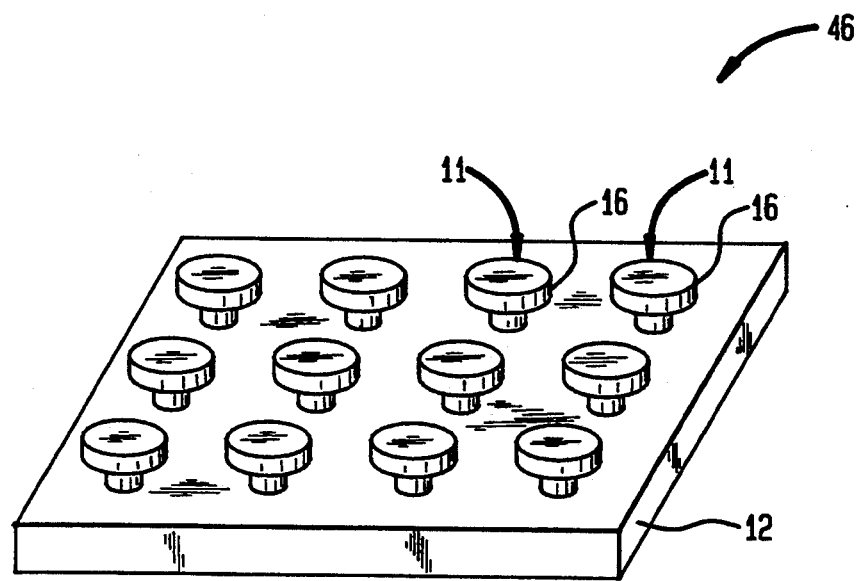
FIG. 4 shows an array in which a plurality of surface-emitting lasers are two-dimensionally arranged according to the present invention.

Furthermore, as is shown in FIG. 4, a plurality of surface-emitting lasers 11 may be two-dimensionally arranged so as to constitute a laser array 46. When the surface-emitting lasers 11 are two-dimensionally arranged, the spacings among the respective surface-emitting lasers 11 are determined by the size of the top mirror 16 of each surface-emitting laser 11, so that the top mirror 16 is desired to have a small area in order to arrange the surface-emitting lasers 11 at high density.

As is described above, the surface-emitting laser 11 of the present invention includes the top mirror provided with a vertical side, and the active layer having an area smaller than that of the top mirror, and consequently the current flowing across the top mirror can be confined in the active layer having a smaller area. Therefore, a high current density is achieved in the active layer, thereby reducing the threshold current. The top mirror can be formed by dry etching so as to have a desired area with high accuracy. On the other hand, the active layer is formed by wet etching, thereby preventing the undesired non-radiative recombination center from being generated in the active layer. Therefore, high external quantum efficiency can be achieved. The areas of the top mirror and the active layer can be independently determined without affecting each other. Especially, when the top mirror has high resistance, the area thereof is made large so as to increase the current to flow across the top mirror.

According to such a method, surface-emitting laser 11 can be produced so that the side of the active layer 20 is not in contact with the semiconductor layer. The side of the active layer 20 is in contact with the air or a passivation film having a refractive index much lower than that of the semiconductor layer, thereby confining much more light.

Figure 5A:
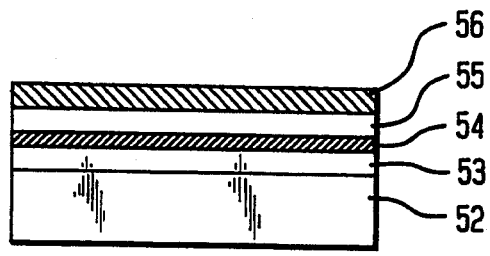
FIGS. 5A to 5F are cross-sectional views illustrating a method for producing an edge-emitting laser in the same manner as that of FIGS. 2A to 2F.

The above method for producing the surface-emitting laser 11 can also be applied to an edge-emitting laser. A method for producing an edge-emitting laser 51 will be described with reference to FIGS. 5A to 5F. As is shown in FIG. 5A, on a substrate 52 made of n-GaAs, a cladding layer 53 made of n-AlGaAs, an active layer 54 made of u-GaAs, a cladding layer 55 made of p-AlGaAs, and a capping layer 56 made of p-GaAs are epitaxially grown in this order.

Figure 5B:
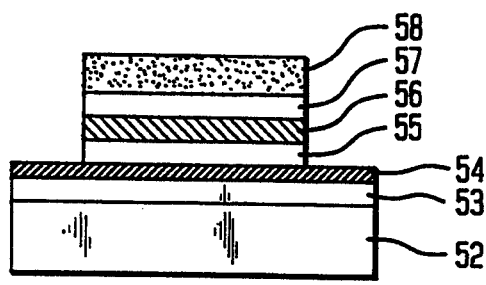

As is shown in FIG. 5B, after a silicon oxide film 57 is formed on the capping layer 56, a resist pattern 58 is formed on the silicon oxide film 57, and the silicon oxide film 57 is etched using the resist pattern 58 as a mask. Thereafter, the cladding layer 55 and the capping layer 56 are subject to the above dry etching step until the active layer 54 is exposed.

Figure 5C:
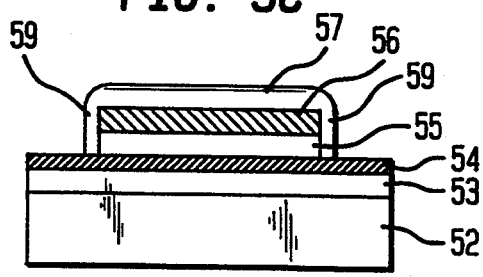

After the resist pattern 58 is removed, a silicon oxide film (not shown) is formed so as to cover the entire surface of the substrate 52, and then the silicon oxide film is etched until the surface of the active layer 54 is exposed. As is shown in FIG. 5C, a sidewall 59 is formed on sides of the capping layer 56 and the cladding layer 55.

Figure 5D:
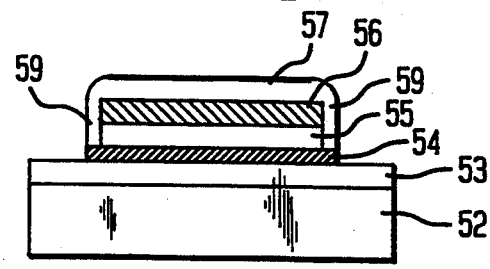
Figure 5E:
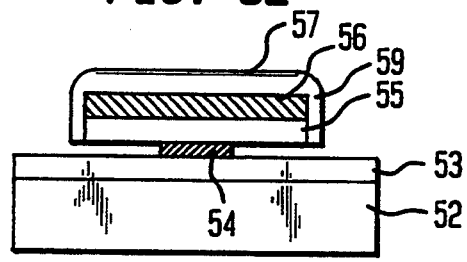
Figure 5F:
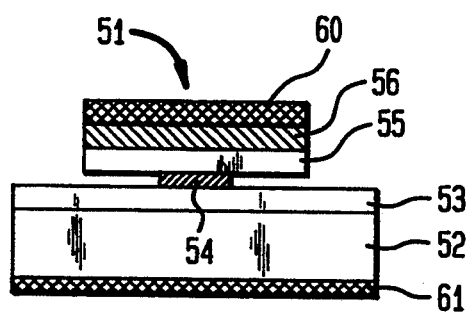

Thereafter, as is shown in FIG. 5D, the active layer 54 is subject to the above dry etching again until the surface of the cladding layer 53 is exposed. Thereafter, a wet etching step is performed using a mixed solution of citric acid, hydrogen peroxide, and water at a weight ratio of 1:1:1 until the active layer 54 has a prescribed area. Finally, the silicon oxide film 57 and the sidewall 59 are removed so that electrodes 60 and 61 are formed on the capping layer 56 and the substrate 52, respectively.

According to such a method, a laser can be produced so that the side of the active layer 54 is not in contact with the semiconductor layer. The side of the active layer 54 is in contact with the air having a refractive index much lower than that of the semiconductor layer, thereby confining much more light.

EXAMPLE 2

Hereinafter, a surface-emitting laser 111 according to a second example of the present invention will be described. FIG. 6E is a cross-sectional view of the surface-emitting laser 111. The surface-emitting laser 111 includes:

a bottom mirror 114 formed on a p-type substrate 112 via a buffer layer 113;

an active region 115 formed on the bottom mirror 114; and a top mirror 116 formed on the active region 115.

The p-type substrate 112 and the buffer layer 113 are both made of p-GaAs. The active region 115 sandwiched between the bottom mirror 114 and the top mirror 116 functions as a vertical resonator.

The active region 115 includes an active layer 120, barrier layers 121 and 122, and spacer layers 122 to 126. The active layer 120 is sandwiched between the barrier layers 121 and 122. Furthermore, the barrier layers 121 and 122 sandwiching the active layer 120 are sandwiched between the spacer layers 123 and 125, and the spacer layers 124 and 126. The active layer 120 is made of undoped $In_{0.2}Ga_{0.8}As$. The barrier layers 121 and 122 are made of undoped GaAs. The spacer layers 123 and 124 are made of undoped $Al_{0.5}Ga_{0.5}As$. The spacer layers 125 and 126 are made of p-$Al_{0.5}Ga_{0.5}As$ and n-$Al_{0.5}Ga_{0.5}As$, respectively. The barrier layers 121 and 122 confine electrons and positive holes in the active layer 120. The spacer layers 122 to 126 are provided for adjusting the length of the vertical resonator so that laser is oscillated at a single-longitudinal mode.

The bottom mirror 114 is a Distributed Bragg Reflector (DBR) in which p-AlAs layers 127 and p-GaAs layers 128 are alternately formed in pairs. Thus, the bottom mirror 114 includes 24.5 pairs of the p-AlAs layers 127 and the p-GaAs layers 128. The top mirror 116 is a Distributed Bragg Reflector (DBR) in which n-AlAs layers 129 and n-GaAs layers 130 are alternately formed in pairs. Thus, the top mirror 116 includes 24 pairs of the n-AlAs layers 129 and the n-GaAs layers 130. The respective thicknesses of the p-AlAs layers 127, the p-GaAs layers 128, the n-AlAs layers 129, and the n-GaAs layers 130 are determined so that the bottom mirror 114 and the top mirror 116 may reflect light having the same wavelength as that of light emitted from the active layer 120.

On the top mirror 116, a buffer layer 117 made of n-GaAs and an n-type substrate 201 are formed. A cathode electrode 118 is electrically connected to the n-type substrate 201. On the p-type substrate 112, an anode electrode 119 is formed.

Hereinafter, a method for producing the surface-emitting laser 111 will be described.

As is shown in FIG. 6A, on the n-type substrate 201, the n-type buffer layer 117, the n-AlAs layers 129, and the n-GaAs layers 130 are epitaxially grown. The n-AlAs layers 129 and the n-GaAs layers 130 constitute a first semiconductor multilayer for the top mirror 116.

As is shown in FIG. 6C, on a p-type substrate 112, the buffer layer 113 made of p-GaAs, the p-AlAs layers 127, the p-GaAs layers 128, the active layer 120, the barrier layers 121 and 122, and the spacer layers 123 to 126 are epitaxially grown. The p-AlAs layers 127 and the p-GaAs layers 128 constitute a second semiconductor multilayer for the bottom mirror 114. The active layer 120, the barrier layers 121 and 122, and the spacer layers 123 to 126 constitute a third semiconductor multilayer for the active region 115. Various epitaxial growth methods are well known for forming these semiconductor layers, but especially a metal organic chemical vapor deposition (MOCVD) method and a molecular beam epitaxy (MBE) method are preferably used to accurately control the respective thicknesses of the semiconductor layers. The semiconductor layers are substantially the same as those described in Example 1, and therefore the description thereof will be omitted.

As is shown in FIG. 6B, a resist pattern 141 is formed on the n-AlAs layer 129 of the n-type substrate 201, and then a dry etching step is performed using the resist pattern 141 as a mask until the surface of the n-type buffer layer 117 is exposed. The dry etching step is performed in the same manner as that in Example 1. As is shown in FIG. 6D, a resist pattern 142 is formed on the spacer layer 126 of the p-type substrate 112, and then a dry etching step is similarly performed using the resist pattern 142 as a mask until the surface of the barrier layer 121 is exposed. At the dry etching step, several nanometers of the damaged portion generated at the side of the active layer 120 may be removed by wet etching. The resist patterns 141 and 142 define the areas of the top mirror 116 and the active layer 120, respectively. For the same reason as that described in Example 1, the resist pattern 141 preferably has the shape of a circle having a diameter of about 10 to 15 m, while the resist pattern 142 preferably has the shape of a circle having a diameter of about 3 to 5 $\mu$m.

Next, the resist patterns 141 and 142 are removed, and then the n-type substrate 201 and the p-type substrate 112 are immersed in a hydrofluoric acid solution, or a mixed solution of sulfuric acid, hydrogen peroxide, and water for about 30 seconds, thereby treating the surfaces of the n-AlAs layer 129 and the spacer layer 126. As is shown in FIG. 6E, the surfaces of the n-AlAs layer 129 and the spacer layer 126 are in contact with each other so that the center of the pattern of the n-AlAs layer 129 of the n-type substrate 201 aligns with the center of the pattern of the spacer layer 126 of the p-type substrate 112. Under such conditions, the n-type substrate 201 and the p-type substrate 112 are left in a reaction chamber of a MOCVD apparatus. While supplying hydrogen gas to the reaction chamber, the n-type substrate 201 and the p-type substrate 112 which are applied close to each other are heated at a temperature of about 600° C. for several hours. Thus, atoms of the surfaces of the n-AlAs layer 129 and the spacer layer 126 combine with each other, so consequently the surfaces are bonded with each other by direct bonding. Finally, the cathode electrode 118 and the anode electrode 119 are formed on the n-type substrate 201 and the p-type substrate 112, respectively.

According to such a method, the top mirror 116, and the active region 115 including the active layer 120 can be independently processed, and therefore the respective areas thereof can be independently determined in accordance with the respective purposes. When the surface-emitting laser 111 is used as a two-dimensional array, the n-type substrate 201 having a semiconductor structure as shown in FIG. 6A is directly bonded with the p-type substrate 112 shown in FIG. 6D, without necessitating a patterning step for the top mirror 116. In this case, a positioning step for the n-type substrate 201 and the p-type substrate 112 is not required either, thereby simplifying the production process.

Figure 7A:
FIGS. 7A to 7E are cross-sectional views illustrating a method for producing an edge-emitting laser in the same manner as that of FIGS. 6A to 6E.
Figure 7B:
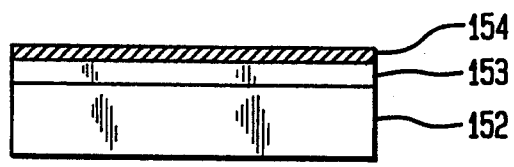

The above method for producing the surface-emitting laser 111 can also be applied to an edge-emitting laser. A method for producing an edge-emitting laser 151 will be described with reference to FIGS. 7A to 7F. As is shown in FIG. 7A, on a semiconductor substrate 155 made of n-GaAs, a cladding layer 156 made of n-AlGaAs is epitaxially grown. Moreover, as is shown in FIG. 7B, on a semiconductor substrate 152 made of p-GaAs, a cladding layer 153 made of n-AlGaAs, and an active layer 154 made of u-GaAs are epitaxially grown in this order.

Figure 7C:
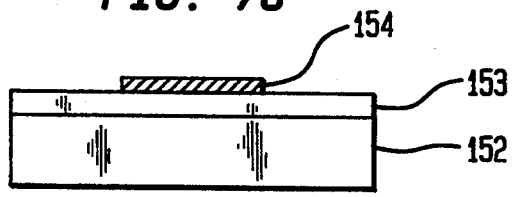
Figure 7D:
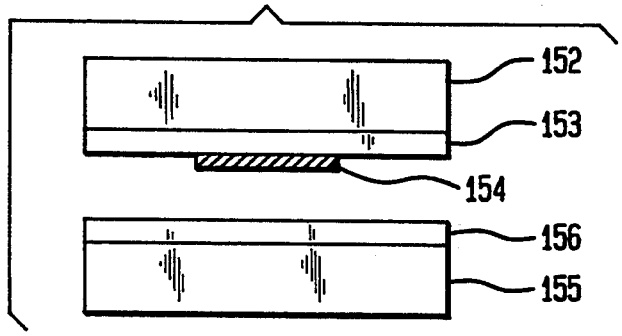
Figure 7E:
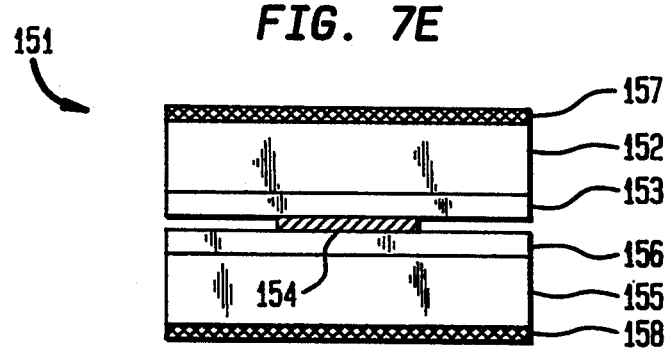
Figure 8A:
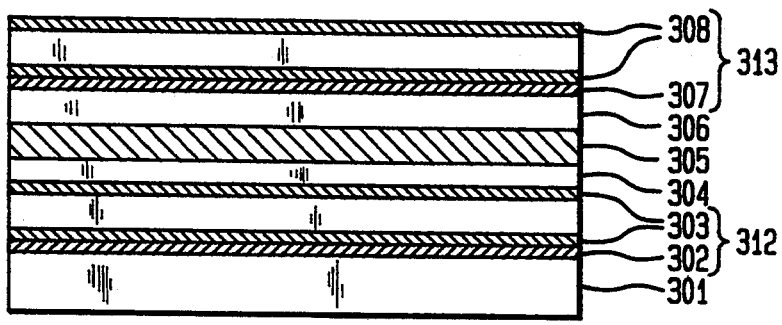
FIGS. 8A to 8D are cross-sectional views illustrating a method for producing a conventional surface-emitting laser.
Figure 8B:
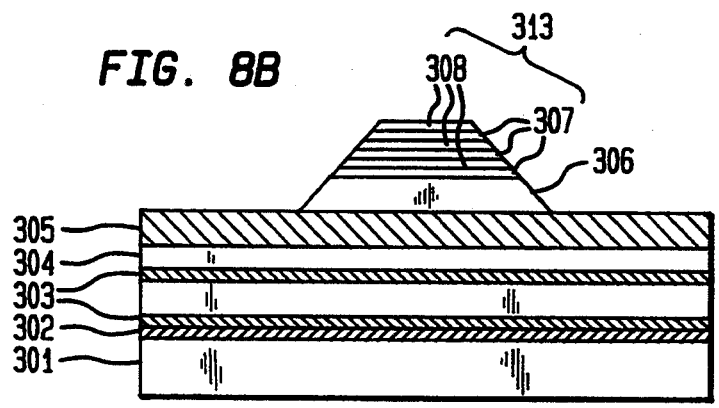
Figure 8C:
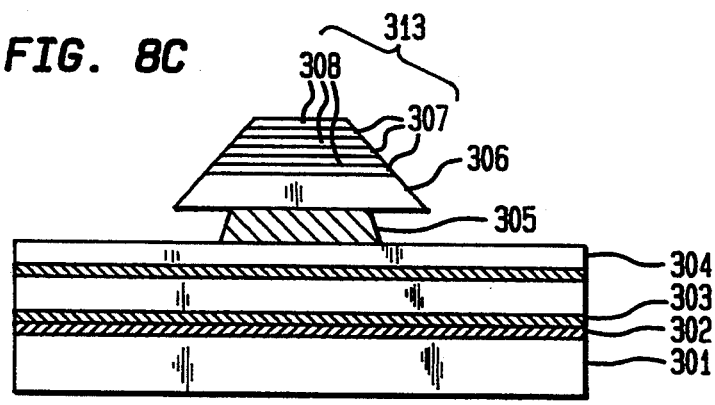
Figure 8D:
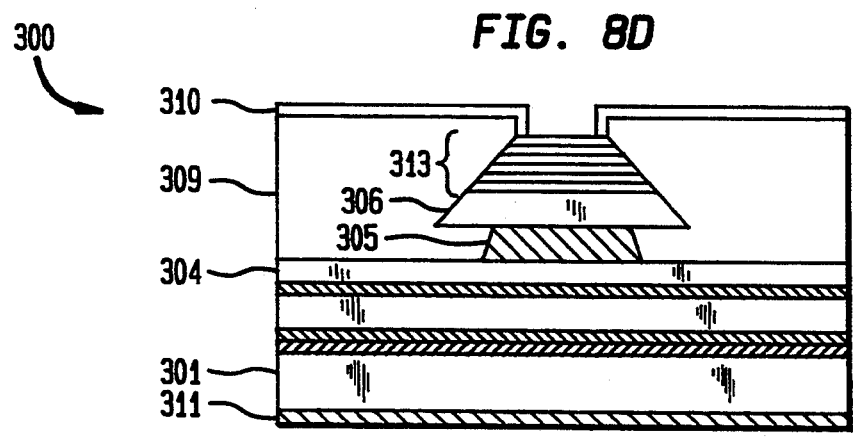
Figure 9A:
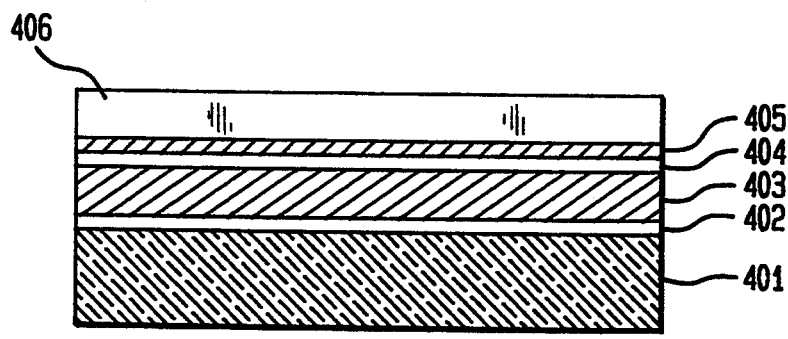
FIGS. 9A to 9C are cross-sectional views illustrating a method for producing a conventional edge-emitting laser.
Figure 9B:
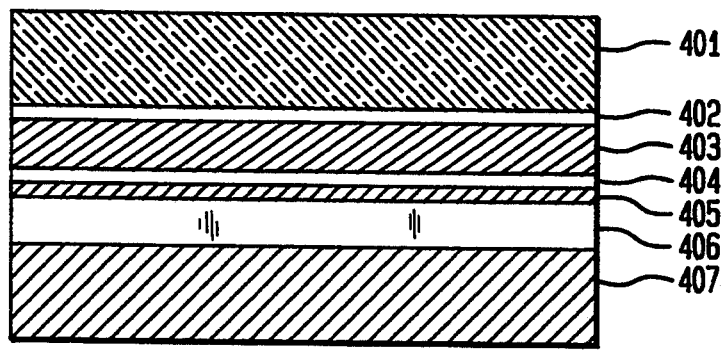
Figure 9C:
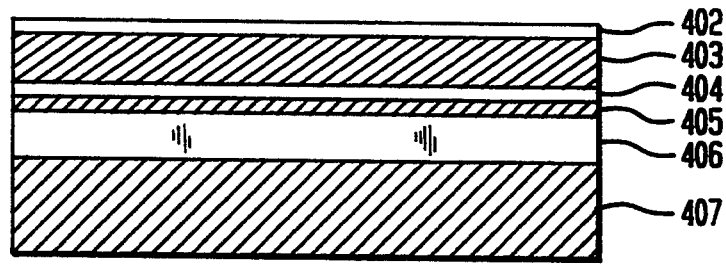

As is shown in FIG. 7C, the active layer 154 is patterned by wet etching and the like so as to have a desired shape. Subsequently, the semiconductor substrates 152 and 155 are immersed in a hydrofluoric acid solution, or a mixed solution of sulfuric acid, hydrogen peroxide, and water for about 30 seconds, and thereby treating the surfaces of the cladding layer 156 and the active layer 154. As is shown in FIG. 7D, the surfaces of the active layer 154 and the cladding layer 156 are applied close to each other and left in a reaction chamber of a MOCVD apparatus. While supplying hydrogen gas to the reaction chamber, the semiconductor substrates 152 and 155 which are applied close to each other are heated at a temperature of about 600° C. for several hours. Thus, atoms of the surfaces of the cladding layer 156 and the active layer 154 combine with each other, and consequently the surfaces are directly bonded to each other. Thereafter, the semiconductor substrate 155 and parts of the cladding layer 156 are removed by wet etching, and then a cathode electrode 157 and an anode electrode 158 are formed on the cladding layer 156 and the semiconductor substrate 152, respectively. According to such a method, a laser can be obtained so that the side of the active layer 154 is not in contact with the semiconductor layer.

According to the present invention, the area of the active layer can be reduced without reducing the areas of the mirrors. Thus, the current can be confined in the active layer without increasing each resistance of the mirrors functioning as current paths. As a result, a surface-emitting laser can be realized with a low threshold value and a low drive voltage.

In the examples 1 and 2, according to the present invention, a surface-emitting laser having an active layer made of InGaAs is produced. The present invention also applies to method for producing a surface-emitting laser having an active layer made of InGaAsP and AlGaInP. Moreover, a protecting film may be made of silicon nitride or photoresist.

Some exemplary values for thickness and impurity concentrations of semiconductor layers and other dimensions are mentioned above. It will be appreciated that other values which will enable operation of the invention described also may be used. Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a surface-emitting laser, comprising the steps of:
    forming a mask pattern to define a top mirror on a semiconductor substrate, said semiconductor substrate having a first semiconductor multilayer formed on said semiconductor substrate, a second semiconductor multilayer formed on said first semiconductor multilayer, and a third semiconductor multilayer formed on said second semiconductor multilayer, said first semiconductor multilayer constituting a bottom mirror, said second semiconductor layer including an upper barrier layer and a lower barrier layer, and an active layer sandwiched between said upper and lower barrier layers, said third semiconductor multilayer constituting a top mirror;
    forming said top mirror by partially removing said third semiconductor layer by dry etching using said mask pattern as a mask until the surface of said upper barrier layer of said second semiconductor multilayer is exposed;
    forming an etching protective film on the side of said top mirror;
    partially removing said active layer, said upper barrier layer, and said lower barrier layer by dry etching using said mask pattern and said etching protective film as masks; and
    partially removing said active layer, said upper barrier layer, and said lower barrier layer by wet etching so that said active layer has an area smaller than that of said top mirror.

2. A method for producing a surface-emitting laser according to claim 1, further comprising the step of forming said first, second, and third semiconductor multilayers on said semiconductor substrate by an epitaxial growth method.

3. A method for producing a surface-emitting laser according to claim 1, wherein said etching protective film is made of silicon oxide.

4. A method for producing a surface-emitting laser using a first semiconductor substrate having a first semiconductor multilayer thereon, and a second semiconductor substrate having a second semiconductor multilayer formed thereon and a third semiconductor multilayer formed on said second semiconductor multilayer, said first semiconductor multilayer constituting a top mirror, said second semiconductor multilayer constituting a bottom mirror, said third semiconductor multilayer including at least an active layer, the method comprising the steps of:
    partially removing said third semiconductor multilayer by etching so that said active layer has a desired shape; and
    making the surface of said first semiconductor multilayer to be in contact with the surface of said third semiconductor multilayer, and heating said second and third semiconductor multilayers under a reduction atmosphere, thereby bonding said first and third semiconductor multilayers with each other by direct bonding.

5. A method for producing a surface-emitting laser according to claim 4, further comprising the step of partially etching said first semiconductor multilayer.

6. A method for producing a semiconductor laser, comprising the steps of:
    forming a mask pattern on a substrate including a bottom cladding layer and a top cladding layer, and an active layer sandwiched between said bottom and top cladding layers;
    partially removing said upper cladding layer by dry etching using said mask pattern as a mask;
    forming an etching protective film at least on the side of said etched upper cladding layer;
    partially removing said active layer by dry etching using said mask pattern and said etching protective film as masks; and
    partially removing said active layer by wet etching, thereby making the area of said active layer smaller than that of said top mirror.

7. A method for producing a semiconductor laser, comprising the steps of:
    preparing a first substrate having a first cladding layer formed thereon and an active layer formed on said first semiconductor substrate;
    partially etching said active layer; and
    making the surface of said active layer in contact with the surface of a second cladding layer formed on a second semiconductor substrate, and heating said first and second cladding layers under a reduction atmosphere, thereby bonding said first cladding layer with said active layer by direct bonding.

* * * * *